US007236364B2

United States Patent
Lee

(10) Patent No.: US 7,236,364 B2
(45) Date of Patent: Jun. 26, 2007

(54) CASE FOR PORTABLE TERMINAL USING COLOR LIQUID CRYSTAL

(75) Inventor: Sang-Min Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 184 days.

(21) Appl. No.: 11/158,573

(22) Filed: Jun. 22, 2005

(65) Prior Publication Data

US 2006/0291167 A1 Dec. 28, 2006

(51) Int. Cl.
*H05K 7/20* (2006.01)

(52) U.S. Cl. .................. 361/701; 361/714; 428/1.5; 349/20; 342/1; 342/3; 342/13; 345/49; 345/105; 345/106

(58) Field of Classification Search .............. 363/679, 363/683, 696, 702, 701, 712, 714; 345/49, 345/105, 106; 359/36, 43, 50, 82, 90, 101; 349/20, 21; 342/1–14, 16, 175, 195; 89/36.01–36.17; 428/17, 919, 1.5; 114/15
See application file for complete search history.

(56) References Cited

U.S. PATENT DOCUMENTS

| | | | | |
|---|---|---|---|---|
| 3,802,945 A | * | 4/1974 | James .................. | 428/1.5 |
| 3,936,817 A | * | 2/1976 | Levy et al. ............ | 345/214 |
| 5,223,958 A | * | 6/1993 | Berry ..................... | 349/20 |
| 5,786,875 A | * | 7/1998 | Brader et al. ........... | 349/20 |
| 6,466,299 B1 | | 10/2002 | Lehtiniemi et al. | |
| 6,927,724 B2 | * | 8/2005 | Snaper ................... | 342/3 |
| 7,142,190 B2 | * | 11/2006 | Martinez ................ | 345/106 |
| 2003/0147527 A1 | | 8/2003 | Mulligan et al. | |
| 2004/0042172 A1 | | 3/2004 | Kusaka et al. | |

FOREIGN PATENT DOCUMENTS

| | | | |
|---|---|---|---|
| DE | 101 08 008 | | 2/2001 |
| FR | 2821233 A1 | * | 9/2004 |
| GB | 2 369 521 A | * | 5/2002 |
| JP | 403104361 A | * | 5/1991 |
| JP | 2000-056290 | * | 2/2000 |

* cited by examiner

*Primary Examiner*—Michael Datskovskiy
(74) *Attorney, Agent, or Firm*—The Farrell Law Firm

(57) ABSTRACT

A case for a portable terminal using a color liquid crystal uses a Peltier device to vary the color of the case by means of electrical heating and cooling the interior of the case. The case includes a temperature control apparatus for emitting electrical heat, when an electrical current is applied thereto, and simultaneously cooling the opposite side; a liquid crystal application agent positioned on the upper portion of the temperature control apparatus and adapted to vary the color by means of the electrical heat; and a cooling unit positioned opposite to an upper portion of the temperature control apparatus to cool heat-generating devices inside the terminal.

20 Claims, 9 Drawing Sheets

CASE FOR PORTABLE TERMINAL USING COLOR LIQUID CRYSTAL

BACKGROUND OF THE INVENTION

1. Field of the Invention

The present invention relates to a case for a portable terminal using a color liquid crystal, and more particularly to a case for a portable terminal using a color liquid crystal which incorporates a Peltier device to vary the color of the case by electrical heating and cooling of the interior of the case.

2. Description of the Related Art

In general, a "portable communication apparatus" refers to an electronic apparatus that a user can carry to perform wireless communication with a desired party. The portable communication apparatus includes a Hand-Held Phone (HHP), a Cordless Telephony (CT-2) cellular phone, a digital phone, a Personal Communication Service (PCS) phone, and a Personal Digital Assistant (PDA). The portable communication apparatus may be classified into various categories according to its appearance, such as a bar-type portable communication apparatus, a flip-type portable communication apparatus, and a folder-type portable communication apparatus. The bar-type communication apparatus has a single housing shaped like a bar. The flip-type communication apparatus has a flip or cover, rotatably coupled to a bar-shaped housing by a hinge device. The folder-type communication apparatus has a folder, connected to a single bar-shaped housing by a hinge device in such a manner that the folder can be rotated to fold on or unfold from the housing. The portable communication apparatus may also be classified as a neck-wearable type portable communication apparatus or a wrist-wearable type portable communication apparatus according to the position or way in which a user puts on the portable communication apparatus. The neck-wearable type portable communication apparatus is worn around the user's neck using a strap or cord. The wrist-wearable type portable communication apparatus is worn around the user's wrist. In addition, the portable communication apparatus, may be classified as a rotation-type portable communication apparatus or a sliding-type portable communication apparatus according to the manner of opening and closing the portable communication apparatus. In the rotation-type portable communication apparatus, two housings are coupled to each other in such a manner that one housing rotates to be opened or closed relative to the other while they face each other. In the sliding-type portable communication apparatus, two housings are coupled to each other in such a manner that one housing slides along a longitudinal direction to be opened or closed relative to the other housing while they face each other. These variously classified portable communication apparatuses can be easily understood by those skilled in the art.

Consistent with the current trend towards an information society and the rapid development of information communication technology, portable communication apparatuses are widely recognized as daily necessities.

Portable communication apparatuses tend to be light and compact for improved portability. Recently, portable terminals small enough to be placed on the palm have become available.

Currently, great importance is attached to the external design of portable terminals, particularly among young people. Various accessories (for example, a doll attached to the terminal by a cord) are used to decorate portable terminals.

For this reason, accessories for portable terminals have become commercial products that are available from many manufacturers.

Some youngsters even express their personalities by uniquely decorating their portable terminals with accessories including toys, strings, and rings.

In addition, young people, being sensitive to the current trends, are very inclined to choose portable telephones based on the external design. Accordingly, portable telephones have been developed in various colors and shapes to satisfy such preferences.

Two methods are mainly used in the industry for manufacturing cases for portable terminals using a color liquid crystal. The first method involves spraying a specific color and modifying the gloss through processing. The second method induces two kinds of color changes by modifying light.

For a conventional portable terminal having a case sprayed with a specific color and processed, if the user wants a different color, then the case itself must be replaced or a sticker and an auxiliary case made of a fiber or leather material must be adhered to the case. This adds the extra expense of replacing the case or buying an auxiliary case. In addition, such additional charge may be incurred every time a different color or shape is desired. As such, conventional terminal cases cannot satisfy desires by young people for unique self-expression.

Conventional portable terminals also have a problem in that heat-generating devices (for example, Liquid Crystal Display (LCD) panels, Printed Circuit Boards (PCBs), and modem chips) positioned therein may overheat the terminals and melt the components. In warm weather, furthermore, high ambient temperature may interfere with convenient use of terminals.

SUMMARY OF THE INVENTION

Accordingly, the present invention has been made to solve the above-mentioned problems occurring in the prior art. An object of the present invention is to provide a case for a portable terminal using a color liquid crystal which has a color liquid crystal adapted to vary the color of the case by use of electrical heat, thereby providing for improved external design of the terminal.

Another object of the present invention is to provide a case for a portable terminal using a color liquid crystal which uses a Peltier device for varying the color of the case by electrically heating and cooling the interior of the case so that the color of the terminal case can be modified in various manners while a heat-generating device (for example, an LCD panel, a PCB, and a modem chip), positioned in the terminal, can simultaneously be cooled.

Still another object of the present invention is to provide a case for a portable terminal using a color liquid crystal which uses a number of color liquid crystals having a Peltier device for varying the color of the case by electrically heating and cooling the interior of the case such that both surfaces of the terminal case can have variously modified colors.

In order to accomplish this object, there is provided a case for a portable terminal using a color liquid crystal including a temperature control apparatus for emitting electrical heat, when an electrical current is applied thereto, and simultaneously cooling the opposite side; a liquid crystal application agent positioned on the upper portion of the temperature control apparatus and adapted to vary the color by means of the electrical heat; and a cooling unit positioned on the side opposite to the upper portion of the temperature control apparatus to cool heat-generating devices inside the terminal.

In accordance with another aspect of the present invention, there is provided a case for a portable terminal using a color liquid crystal including a temperature control apparatus for emitting electrical heat, when an electrical current is applied thereto, and simultaneously cooling the opposite side; first and second liquid crystal application agents positioned on the upper and lower portions of the temperature control apparatus, respectively, and adapted to vary the color by means of the electrical heat; and cooling units positioned opposite to the upper and lower portions of the temperature control apparatus, respectively, to cool heat-generating devices inside the terminal.

In accordance with another aspect of the present invention, there is provided a case for a portable terminal using a color liquid crystal including a temperature control apparatus for emitting electrical heat when an electrical current is applied thereto; a heat transfer substrate positioned on the upper portion of the temperature control apparatus to transmit the electrical heat emitted from the temperature control apparatus; and a liquid crystal application agent positioned on the upper portion of the heat transfer substrate and adapted to vary the color by means of the electrical heat.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENT

Figure 1:
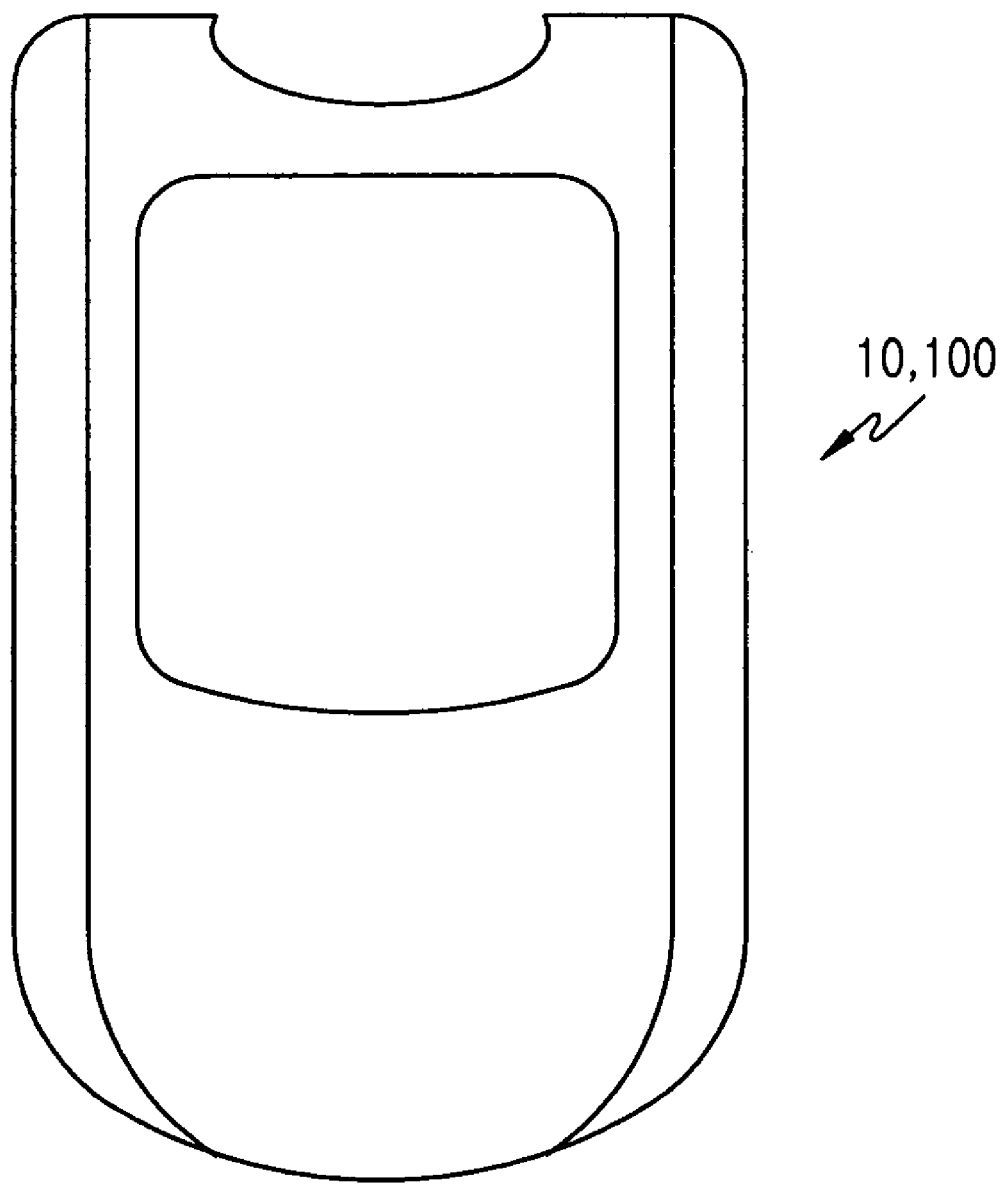
FIG. 1 is a front view showing a case for a portable terminal using a color liquid crystal according to a first embodiment of the present invention.

Hereinafter, a preferred embodiment of the present invention will be described with reference to the accompanying drawings. In the following description of the present invention, a detailed description of known functions and configurations incorporated herein is omitted to avoid making the subject matter of the present invention unclear.

Referring to FIGS. 1 to 5, a case 100 for a portable terminal 10 using a color liquid crystal includes a temperature control apparatus 200, a color filter substrate 300, and a liquid crystal application agent 500. The temperature control apparatus 200 has a Peltier device 203 to emit electrical heat, as an electrical current is applied, and cool the opposite side. The color filter substrate 300 is positioned on the upper portion of the temperature control apparatus 200 to vary the color by means of the electrical heat emitted from the Peltier device 203.

Thermoelectrics are based on the Peltier Effect, by which a DC current applied across two dissimilar materials causes a temperature differential. A typical thermoelectric module employs a series of P and N doped semiconductor material sandwiched between substrate material. The N type material has an excess of electrons, while the P type material has a deficit of electrons. As the electrons move from the P type material to the N type material through an electrical connector, the electrons jump to a higher energy state, absorbing thermal energy (cold side). Continuing through the lattice of material, the electrons flow from the N type material to the P type material through an electrical connector, dropping to a lower energy state and releasing energy as heat to the heat sink (hot side). The liquid crystal application agent 500 is positioned on the upper portion of the color filter substrate 300 to reflect the color change caused by the color filter substrate 300. The color filter substrate 300 includes color patterns of red R, green G, and blue B.

When an electrical current is applied to the Peltier device 203, the upper portion thereof emits heat and varies the color of the liquid crystal application agent 500 via the color filter substrate 300 and the lower portion thereof is cooled so that heat generation devices (for example, an LCD panel 600, a PCB 700, and a modem chip (not shown) positioned in the terminal 100 can be cooled.

The temperature control apparatus 200 includes first and second heat transfer substrates 201 and 202, a Peltier device 203, and at least one pair of input terminals 204. The first and second heat transfer substrates 201 and 202 are positioned on the upper and lower portions of the Peltier device 203, respectively, to emit the heat from the Peilter device 203 and to be cooled simultaneously. The first and second heat transfer substrates 201 and 202 are preferably made of a metallic material.

The Peilter device 203 is positioned between the first and second heat transfer substrates 201 and 202 and is adapted to emit heat, when an electrical current is applied to the second heat transfer substrate 202, and transfer the heat to the first heat transfer substrate 201, while simultaneously cooling the second heat transfer substrate 202. The second heat transfer substrate thus acts as a cooling unit, able to absorb heat from its surroundings or from objects placed in contact. Each individual input terminal of the at least one pair of input terminals 204 has an electrical contact point positioned on the second heat transfer substrate 202 and is connected to that associated contact point. The input terminal 204 is preferably a Flexible Printed Circuit Board (FPCB).

The operation of a case for a portable terminal using a color liquid crystal according to a first embodiment of the present invention, constructed as above, will now be described in detail with reference to FIGS. 1 to 5.

Figure 2:
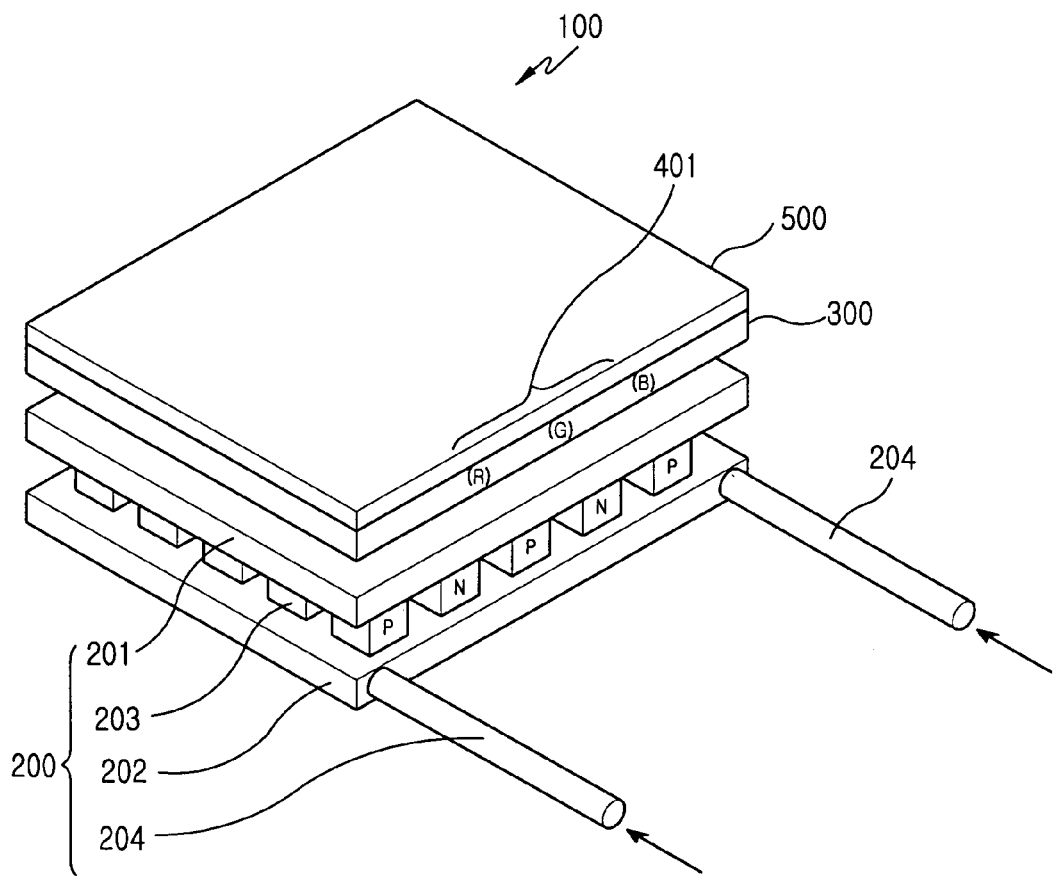
FIG. 2 is a perspective view showing the construction of a case for a portable terminal using a color liquid crystal according to a first embodiment of the present invention.

As shown in FIGS. 1 and 2, a case 100 for a portable terminal using a color liquid crystal includes a temperature control apparatus 200, a color filter substrate 300, and a liquid crystal application agent 500, and the temperature control apparatus 200 has a Peltier device 203 to emit electrical heat, as an electrical current is applied, and to cool the opposite side. The color filter substrate 300 has a number of colors and is positioned on the upper portion of the Peltier device 203 to vary the color by means of the electrical heat emitted from the Peltier device 203.

The second heat transfer substrate 202 beneath the Peltier device 203 is supplied with an electrical current from a battery (not shown) of the terminal.

Figure 3:
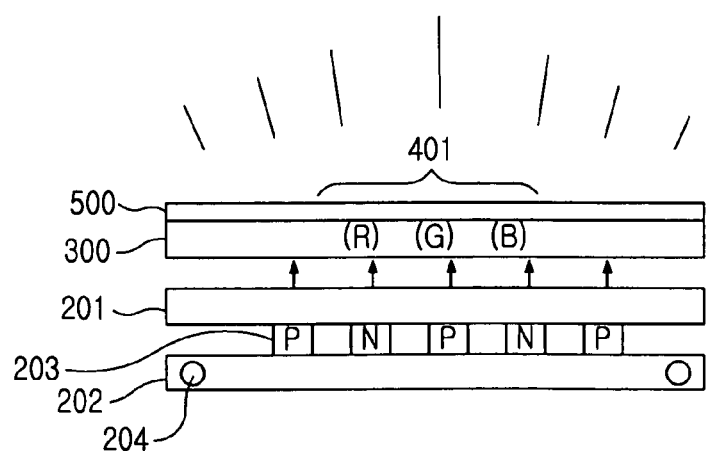
FIG. 3 is a lateral view showing the operation of a first heat transfer substrate, a second color filter substrate, and a liquid crystal application agent, caused by the difference in electrical potential of a Peltier device, when an electrical current is applied to a second heat transfer substrate with the same construction shown in FIG. 2.

When an electrical current is applied to the second heat transfer substrate 202, as shown in FIGS. 2 and 3, the Peltier device 203 emits heat and transfers it to the first heat transfer substrate 201, while simultaneously cooling the second heat transfer substrate 202.

Figure 5:
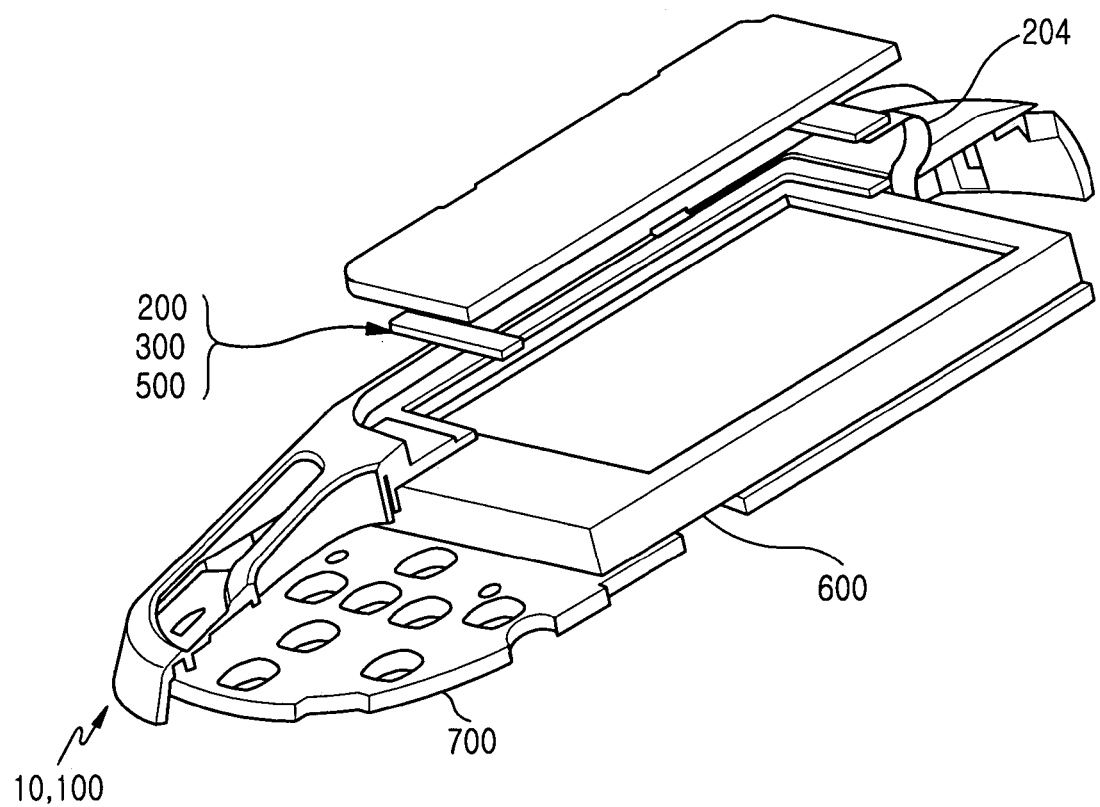
FIG. 5 is an exploded perspective view showing a case for a portable terminal using a color liquid crystal, during service, according to a first embodiment of the present invention.

As the heat from the Peltier device 203 is transferred to the first heat transfer substrate 201, as shown in FIG. 5, the color of the color filter substrate 300 and that of the liquid crystal application agent 500 vary and the second heat transfer substrate 202 is cooled. As such, heat-generating devices positioned in the terminal 10 are cooled accordingly.

When an electrical current is applied to the second heat transfer substrate 202 positioned beneath the Peltier device 203 via the input terminals 204, as shown in FIGS. 2 and 5, a difference in electrical potential occurs between p-type and n-type semiconductors constituting the Peltier device 203. Heat is generated due to the difference in electrical potential and is transferred simultaneously. As the heat is transferred to the first heat transfer substrate 201 positioned on the upper portion of the Peltier device 203 and is emitted, the second heat transfer substrate 202 is cooled.

As shown in FIG. 3, the color filter substrate 300 varies the color by means of the heat transferred from the first heat transfer substrate 201.

The color filter substrate 300 has a color pattern 401 including red R, green G, and blue B and can express at least seven colors by combining red R, green G, and blue B of the color pattern.

Various colors created by the color filter substrate 300 are exposed to the exterior via the liquid crystal application agent 500 positioned on the upper portion of the color filter substrate 300.

Figure 4:
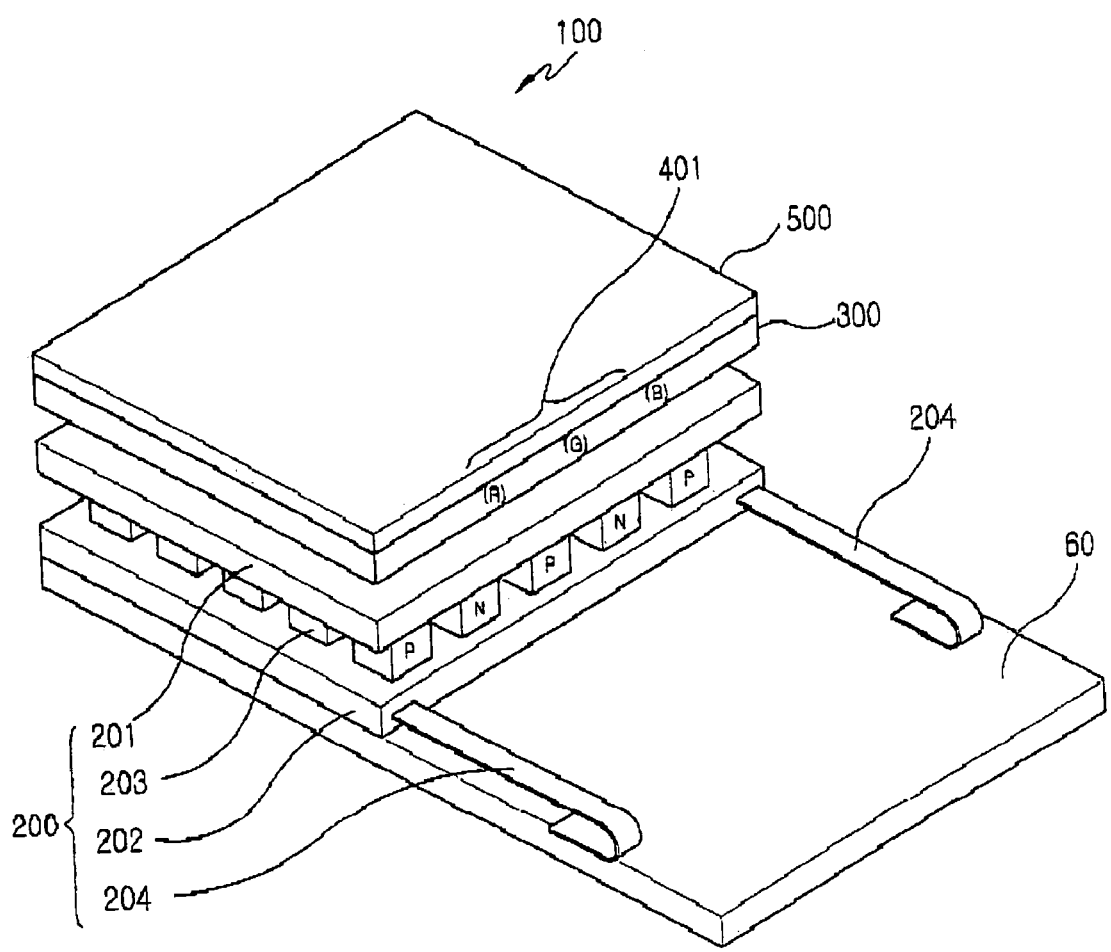
FIG. 4 is a perspective view showing an alternative input terminal for the construction of a case for a portable terminal using a color liquid crystal according to a first embodiment of the present invention.

FIG. 4 shows alternative input terminals 204 of FPCB for easy connection between the main board 60 of the terminal and the Peltier device 203.

The operation of a case for a portable terminal using a color liquid crystal according to a second embodiment of the present invention, constructed as above, will now be described in detail with reference to FIGS. 6 to 10.

As shown in FIGS. 6 to 10, a case 100 for a portable terminal using a color liquid crystal includes a temperature control apparatus 200, a first and a second color filter substrate 300 and 400, and a first and a second liquid crystal application agent 500 and 510.

The first and second color filter substrates 300 and 400 have a number of colors and are positioned on the upper and lower portions of the Peltier device 203, respectively, to vary the color by means of the electrical heat emitted from the Peltier device 203.

The first and second heat transfer substrates 201 and 202 of the temperature control apparatus 200 are selectively supplied with electrical currents from a battery (not shown) of the terminal. Each of the heat transfer substrates 201 and 202 has electrical contact points and two input terminals 204 to be connected to the electrical contact points.

The temperature control apparatus 200 has a Peltier device 203 to emit electrical heat as electrical currents ① and ② are applied. As currents ① and ② are applied, the temperature control apparatus 200 transfers the heat emitted from the Peltier device 203 to each of the first and second heat transfer substrates 201 and 202.

When currents are selectively applied to the heat transfer substrates 201 and 202, respectively, the Peltier device 203 generates a difference in electrical potential and emits heat to the first and second heat transfer substrates 201 and 202 while simultaneously cooling them.

Figure 6:
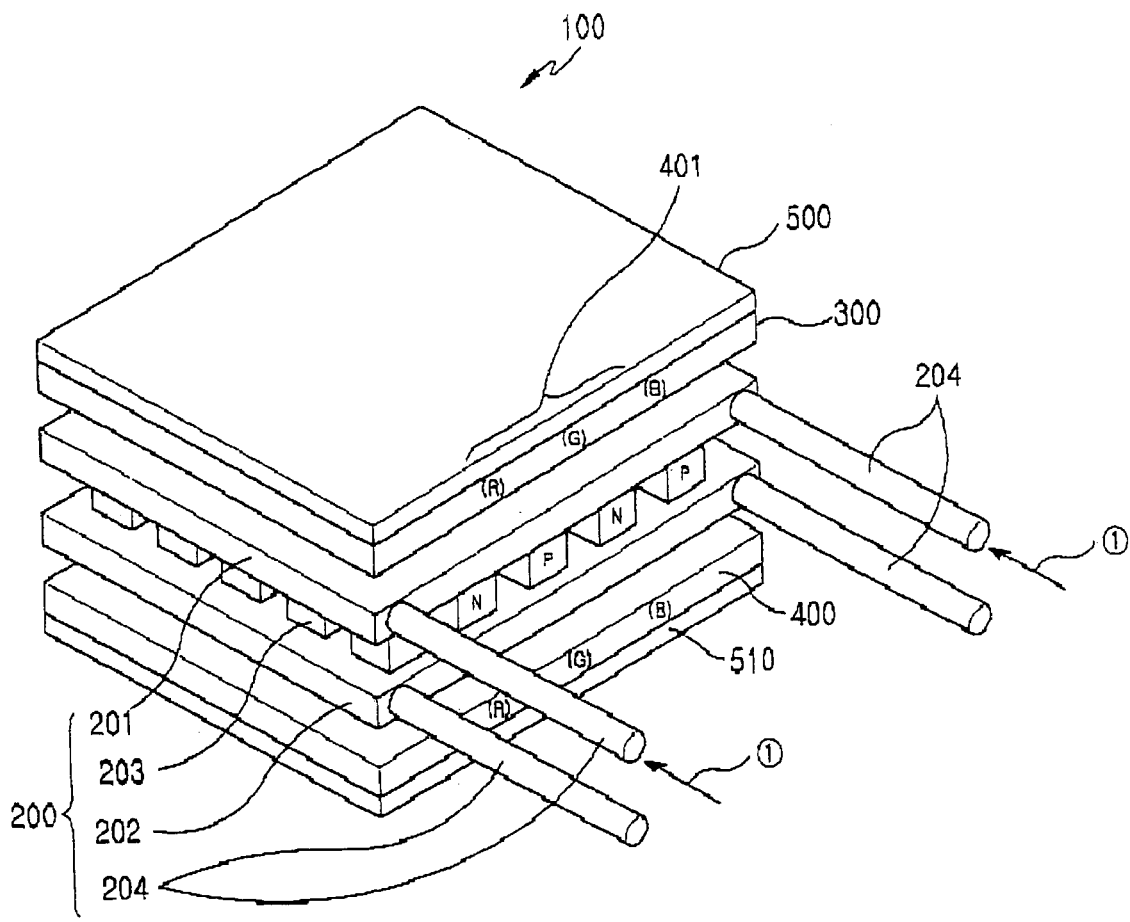
FIG. 6 is a perspective view showing the construction of a case for a portable terminal using a color liquid crystal according to a second embodiment of the present invention, when an electrical current is applied to an input terminal of a first heat transfer substrate.
Figure 7:
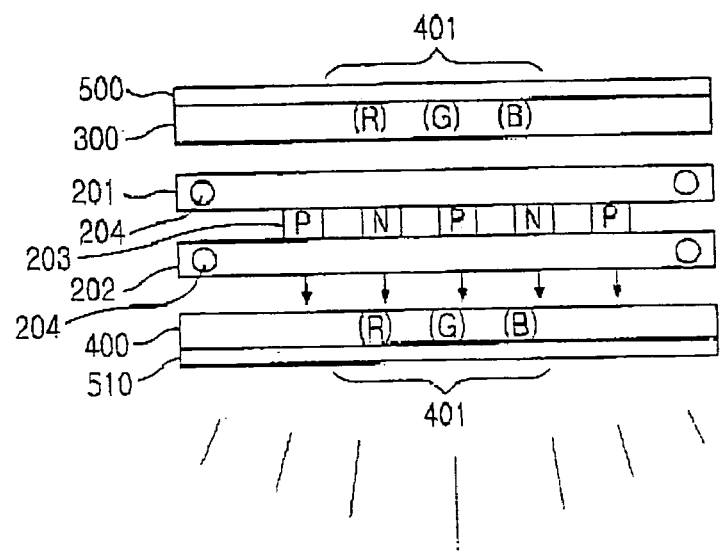
FIG. 7 is a lateral view showing the operation of a second heat transfer substrate, a second color filter substrate, and a second liquid crystal application agent, caused by the difference in electrical potential of a Peltier device, when an electrical current is applied to a first heat transfer substrate in the construction shown in FIG. 6.

When an electrical current ① is applied to the first heat transfer substrate 201 positioned on the upper portion of the Peltier device 203 via the input terminals 204, as shown in FIGS. 6 and 7, a difference in electrical potential occurs between p-type and n-type semiconductors constituting the Peltier device 203. Heat is generated due to the difference in electrical potential and is transferred simultaneously. As the heat is transferred to the second heat transfer substrate 202 positioned beneath the Peltier device 203 and is emitted, the first heat transfer substrate 201 is cooled.

As shown in FIG. 7, the second color filter substrate 400 varies the color by means of the heat transferred from the second heat transfer substrate 201.

The second color filter substrate 400 has a color pattern 401 including red R, green G, and blue B and can express at least seven colors by combining red R, green G, and blue B of the color pattern.

Various colors created by the second color filter substrate 400 are exposed to the exterior via the second liquid crystal application agent 510 positioned on the upper portion of the second color filter substrate 400.

Figure 8:
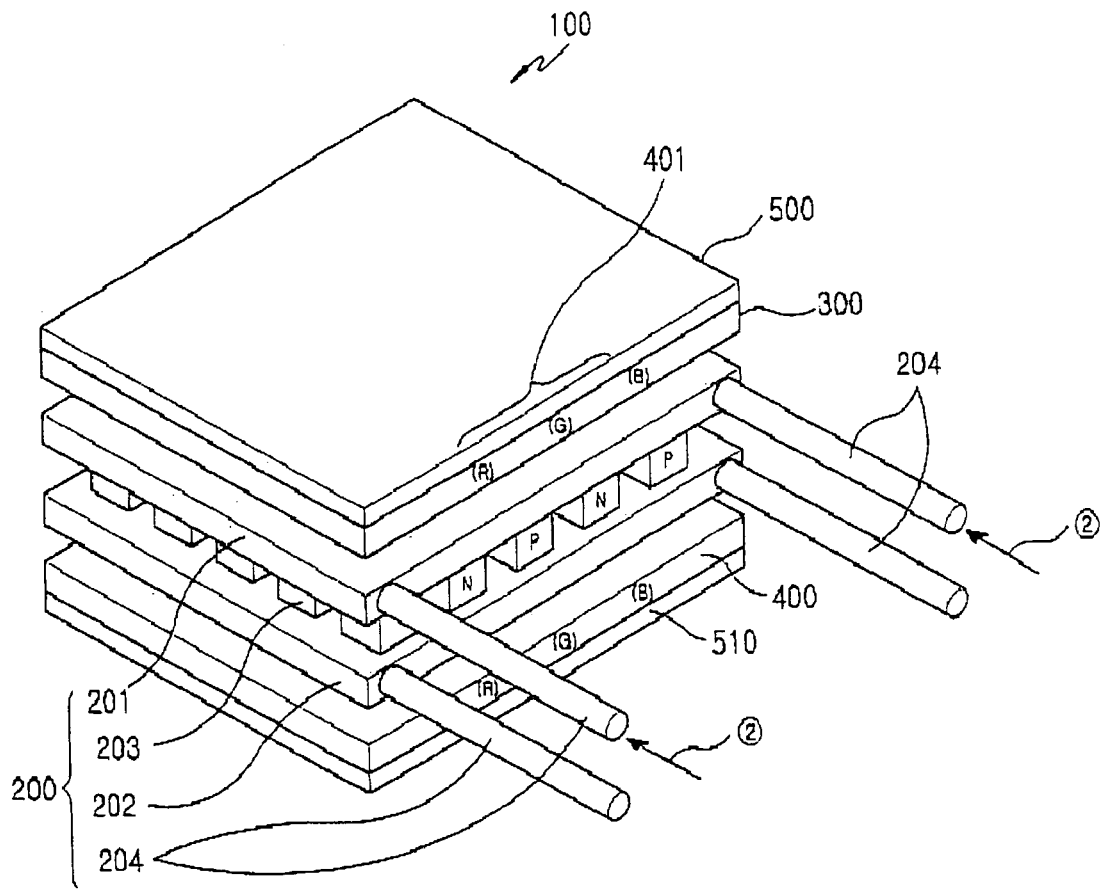
FIG. 8 is a perspective view showing the construction of a case for a portable terminal using a color liquid crystal according to a second embodiment of the present invention, when an electrical current is applied to an input terminal of a second heat transfer substrate.
Figure 9:
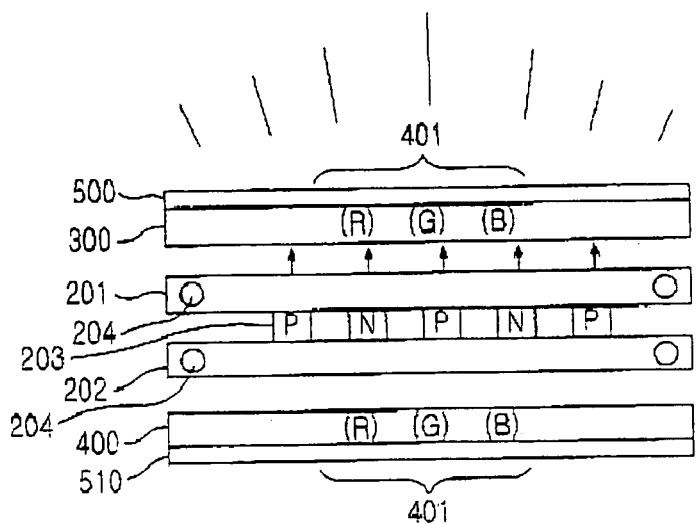
FIG. 9 is a lateral view showing the operation of a first heat transfer substrate, a first color filter substrate, and a first liquid crystal application agent, caused by the difference in electrical potential of a Peltier device, when an electrical current is applied to a second heat transfer substrate in the construction shown in FIG. 8.

When an electrical current ② is applied to the second heat transfer substrate 202 positioned beneath the Peltier device 203 via the input terminals 204 connected to the second heat transfer substrate 202, as shown in FIGS. 8 and 9, a difference in electrical potential occurs between p-type and n-type semiconductors constituting the Peltier device 203. Heat is generated due to the difference in electrical potential and is transferred simultaneously. As the heat is transferred to the first heat transfer substrate 201 positioned on the upper portion of the Peltier device 203 and is emitted, the second heat transfer substrate 202 is cooled.

The ability to create cooling, at both the first heat transfer substrate 201 located on the upper portion of the temperature control unit and the second heat transfer substrate 202 located on the lower portion of the temperature control unit, in effect, provides a cooling unit positioned opposite to the lower portion of the temperature control unit and a cooling unit opposite to the upper portion of the control unit.

As shown in FIG. 9, the first color filter substrate 300 varies the color by means of the heat transferred from the first heat transfer substrate 201. Various colors created by the first color filter substrate 300 are exposed to the exterior via the first liquid crystal application agent 500 positioned on the upper portion of the first color filter substrate 300. As the second heat transfer substrate 202 is cooled, heat generation devices (for example, an LCD panel 600) positioned in the terminal are cooled.

Figure 10:
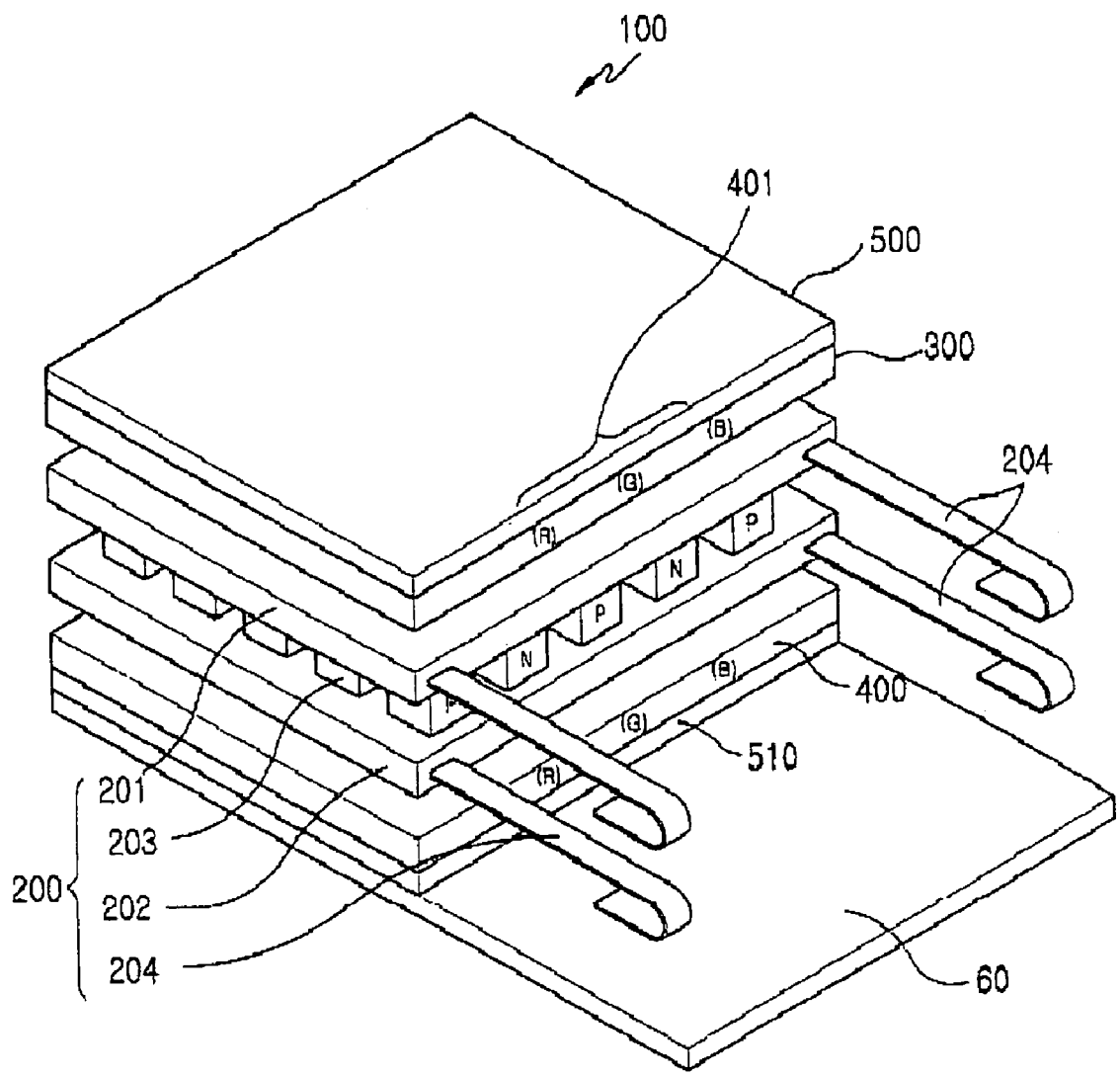
FIG. 10 is a perspective view showing an alternative input terminal in the construction of a case for a portable terminal using a color liquid crystal according to a second embodiment of the present invention.

FIG. 10 shows alternative input terminals 204 which are made of FPCB for easy connection between the main board 60 of the terminal and the Peltier device 203.

The operation of a case for a portable terminal using a color liquid crystal according to a third embodiment of the present invention, constructed as above, will now be described in detail with reference to FIGS. 11 to 13.

Figure 11:
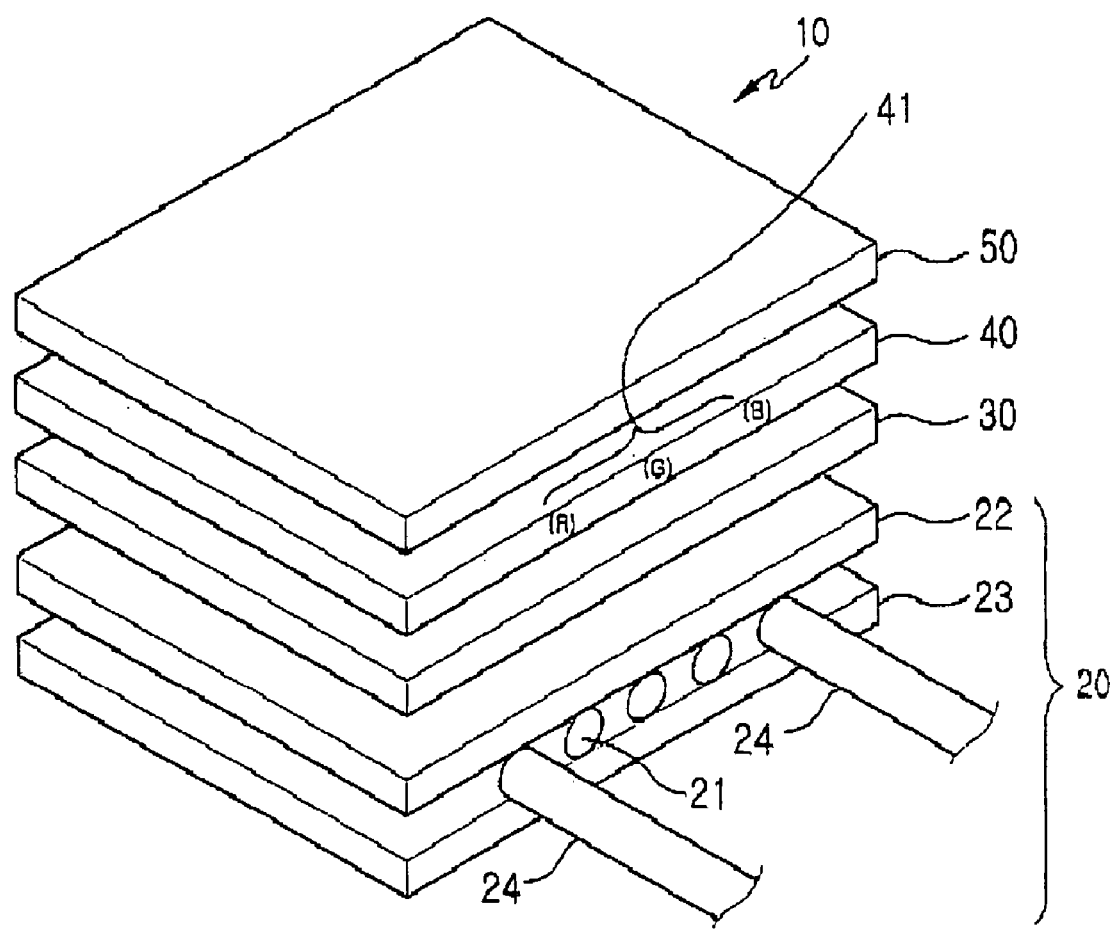
FIG. 11 is a perspective view showing the construction of a case for a portable terminal using a color liquid crystal according to a third embodiment of the present invention.
Figure 12:
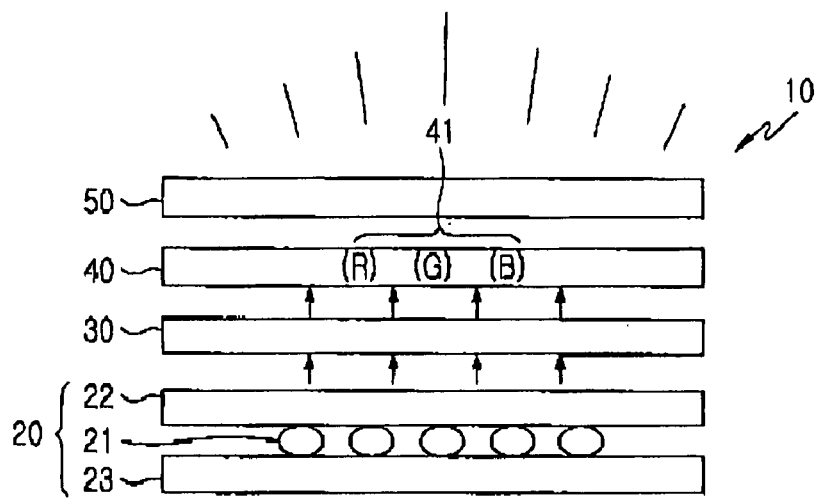
FIG. 12 is a lateral view showing the operation of a case for a portable terminal using a color liquid crystal according to a third embodiment of the present invention.
Figure 13:
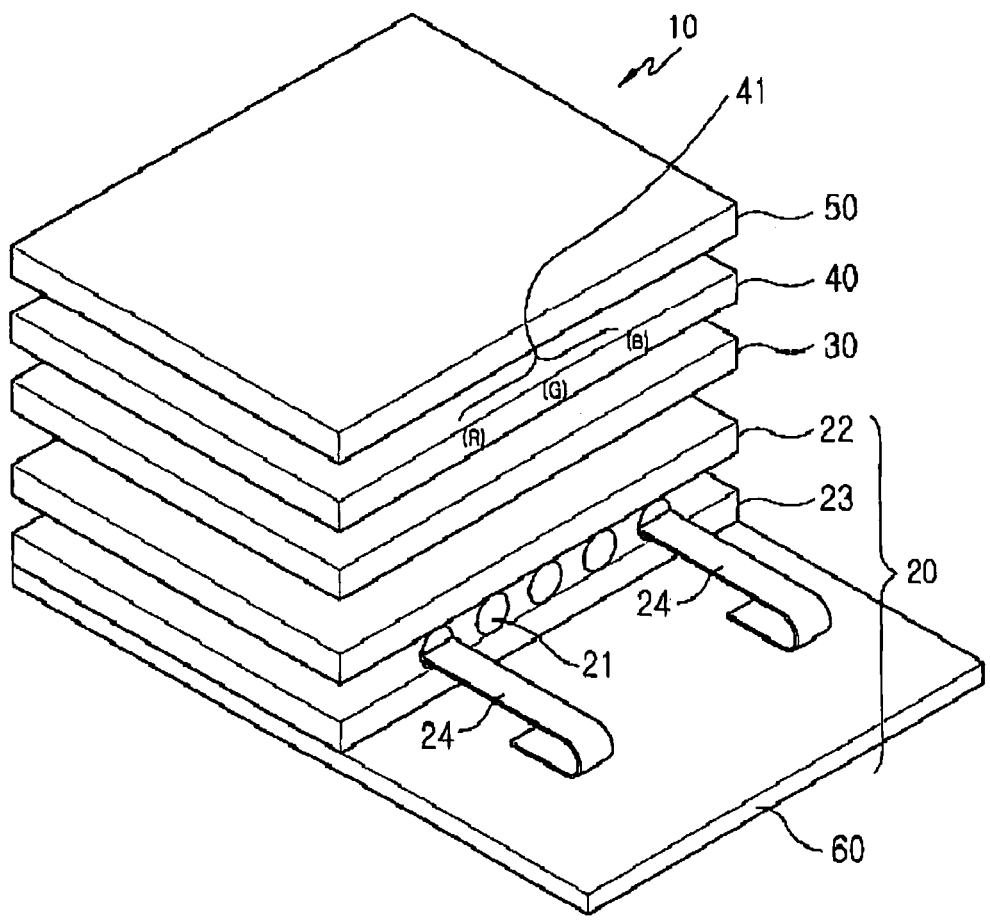
FIG. 13 is a perspective view showing an alternative input terminal in the construction of a case for a portable terminal using a color liquid crystal according to a third embodiment of the present invention.

As shown in FIGS. 11 to 13, a case 10 for a portable terminal using a color liquid crystal includes a temperature control apparatus 20, a heat transfer substrate 30, a color filter substrate 40, and a crystal application agent 50.

A resistant body 21 of the temperature control apparatus 20 is supplied with an electrical current from a battery (not shown) of the terminal. As shown in FIG. 11, each resistant body 21 has electrical contact points and at least one pair of input terminals 24 connected to the electrical contact points to supply the electrical current.

As shown in FIG. 12, the resistant body 21 emits a small amount of electrical heat, which passes through a conductive film 22 positioned on the upper portion of the resistant body 21. After passing through the conductive film 22, the heat is transferred to the heat transfer substrate 30 positioned on the upper portion of the conductive film 22. The electrical heat is transferred to the color filter substrate 40 via the heat transfer substrate 30. The color filter substrate 40 varies the color by means of the electrical heat transferred from the heat transfer substrate 30. The color filter substrate 40 has a color pattern 41 including red R, green G, and blue B and can express at least seven colors by combining red R, green G, and blue B of the color pattern 41. Various colors created by the color filter substrate 40 are exposed to the exterior via the liquid crystal application agent 50 positioned on the upper portion of the color filter substrate 40.

As mentioned above, the temperature control apparatus 20 has a specific temperature bandwidth 0° C.–50° C. so that the red R, green G, and blue B of the color pattern 41 are combined into various colors to modify the exterior of the case. As such, the external design of the portable terminal is improved.

FIG. 13 shows alternative input terminals 24 which are made of an FPCB for easy connection between the main board 60 of the terminal and the resistant body 21.

While the invention has been shown and described with reference to certain preferred embodiments thereof, it will be understood by those skilled in the art that various changes in form and details may be made therein without departing from the spirit and scope of the invention as defined by the appended claims.

For example, the present invention is applicable to all kinds of portable terminals.

What is claimed is:

1. A case for a portable terminal using a color liquid crystal, the case comprising:
   a temperature control apparatus, for emitting electrical heat from one side and simultaneously cooling an opposite side, when an electrical current is applied thereto;
   a liquid crystal application agent positioned on an upper portion of the temperature control apparatus and adapted to vary the color of the case by means of the electrical heat; and
   a cooling unit positioned on a side opposite to the upper portion of the temperature control apparatus to cool heat-generating devices positioned inside the terminal.

2. The case for a portable terminal using a color liquid crystal as claimed in claim 1, wherein the temperature control apparatus includes a Peltier device.

3. The case for a portable terminal using a color liquid crystal as claimed in claim 2, wherein a color filter substrate having a plurality of colors is positioned between the temperature control apparatus and the liquid crystal application agent to vary the color by means of electrical heat emitted from the Peltier device.

4. The case for a portable terminal using a color liquid crystal as claimed in claim 3, wherein the color filter substrate comprises color patterns of red, green, and blue.

5. The case for a portable terminal using a color liquid crystal as claimed in claim 2, wherein the temperature control apparatus has first and second heat transfer substrates positioned, respectively, on an upper portion and a lower portion of the Peltier device; the Peltier device being adapted to emit heat as an electrical current is applied to the second heat transfer substrate, and transfer the heat to the first heat transfer substrate while cooling the second heat transfer substrate; and the second heat transfer substrate has an electrical contact point to which at least one input terminal is connected.

6. The case for a portable terminal using a color liquid crystal as claimed in claim 5, wherein the input terminal is a flexible printed circuit board (FPCB).

7. The case for a portable terminal using a color liquid crystal as claimed in claim 5, wherein the first and second heat transfer substrates are made of a metallic material.

8. A case for a portable terminal using a color liquid crystal, the case comprising:
   a temperature control apparatus, for emitting electrical heat from one side and simultaneously cooling an opposite side, when an electrical current is applied thereto;
   a first and a second liquid crystal application agent positioned on an upper and a lower portion of the temperature control apparatus, respectively, and adapted to vary the color of the case by means of the electrical heat; and
   cooling units positioned adjacent to the upper and lower portions of the temperature control apparatus, respectively, to cool heat-generating devices positioned inside the terminal.

9. The case for a portable terminal using a color liquid crystal as claimed in claim 8, wherein the temperature control apparatus includes a Peltier device.

10. The case for a portable terminal using a color liquid crystal as claimed in claim 9, wherein a first and a second color filter substrate, each having a plurality of colors are positioned between the temperature control apparatus and each respective liquid crystal application agent to vary the color of the case by means of the electrical heat emitted from the Peltier device.

11. The case for a portable terminal using a color liquid crystal as claimed in claim 10, wherein the first and second color filter substrates comprise color patterns of red, green, and blue.

12. The case for a portable terminal using a color liquid crystal as claimed in claim 9, wherein the temperature control apparatus has first and second heat transfer substrates positioned on upper and lower portions of the Peltier device; the Peltier device being adapted to emit heat as an electrical current is selectively applied to one of the heat transfer substrates, and transfer the heat to the corresponding heat transfer substrate while cooling the other heat transfer substrate; and each of the heat transfer substrates has electrical contact points, to which at least one input terminal is connected.

13. The case for a portable terminal using a color liquid crystal as claimed in claim 12, wherein the input terminal is an FPCB.

14. The case for a portable terminal using a color liquid crystal as claimed in claim 12, wherein the first and second heat transfer substrates are made of a metallic material.

15. The case for a portable terminal using a color liquid crystal as claimed in claim 12, wherein the Peltier device comprises p-type and n-type semiconductors; wherein when an electrical current is applied to a first heat transfer substrate, a difference in electrical potential occurs between the p-type and n-type semiconductors and heat is generated, which is transferred to a second heat transfer substrate and emitted while cooling the first heat transfer substrate; and, when an electrical current is applied to the second heat transfer substrate, a difference in electrical potential occurs between the p-type and n-type semiconductors and heat is generated, which is transferred to the first heat transfer substrate and emitted while cooling the second heat transfer substrate.

16. A case for a portable terminal using a color liquid crystal, the case comprising:

a temperature control apparatus for emitting electrical heat when an electrical current is applied thereto;

a heat transfer substrate positioned on an upper portion of the temperature control apparatus to transmit the electrical heat emitted from the temperature control apparatus; and a liquid crystal application agent positioned on the upper portion of the heat transfer substrate and adapted to vary the color of the case by means of the electrical heat.

17. The case for a portable terminal using a color liquid crystal as claimed in claim 16, wherein a color filter substrate having a plurality of colors is positioned between the heat transfer substrate and the liquid crystal application agent to vary the color of the case by means of the electrical heat transmitted from the heat transfer substrate.

18. The case for a portable terminal using a color liquid crystal as claimed in claim 16, wherein the temperature control apparatus comprises:

a resistant body for emitting heat by means of an electrical current applied from corresponding input terminals;

a conductive film positioned on an upper portion of the resistant body to transfer heat to the heat transfer substrate; and an insulating film positioned on a lower portion of the resistant body.

19. The case for a portable terminal using a color liquid crystal as claimed in claim 18, wherein the resistant body has electrical contact points, to which the input terminals are connected.

20. The case for a portable terminal using a color liquid crystal as claimed in claim 18, wherein the input terminals are an FPCB.

* * * * *